United States Patent [19]
Oimura et al.

[11] Patent Number: 6,160,253
[45] Date of Patent: Dec. 12, 2000

[54] PHOTO DETECTOR HAVING A PLURALITY OF SEMICONDUCTOR LAYERS

[75] Inventors: Katsuhiko Oimura, Ohtsu; Katsuich Oosawa, Takatsuki, both of Japan

[73] Assignee: Matsushita Electronics Corporation, Osaka, Japan

[21] Appl. No.: 09/164,353

[22] Filed: Oct. 1, 1998

[30] Foreign Application Priority Data

Oct. 1, 1997 [JP] Japan .................................. 9-268315

[51] Int. Cl.[7] .................................................. H01L 31/00
[52] U.S. Cl. ................................ 250/214.1; 250/214 R; 257/432
[58] Field of Search .................. 250/214.1, 214 LA, 250/214 LS, 214 R; 257/432, 458, 459

[56] References Cited

U.S. PATENT DOCUMENTS 5,304,815   4/1994   Suzuki et al. ............................. 257/10

FOREIGN PATENT DOCUMENTS

| | | |
|---|---|---|
| 6430861 | 2/1989 | Japan . |
| 3159180 | 7/1991 | Japan . |
| 3203381 | 9/1991 | Japan . |
| 758473 | 3/1995 | Japan . |
| 7169990 | 7/1995 | Japan . |
| 738142 | 7/1995 | Japan . |

*Primary Examiner*—Que T. Le
*Attorney, Agent, or Firm*—Stevens, Davis, Miller & Mosher, L.L.P.

[57] ABSTRACT

In order to provide a photo detector in which the generation of spontaneous noise is suppressed and external noise is effectively reduced, a p-type diffusion layer is provided on the obverse side of an n-type semiconductor substrate, a p-type low-resistance layer is provided on the obverse side of the p-type diffusion layer, a lead frame is provided on the reverse side of the n-type semiconductor substrate with an insulative resin film in between, and the p-type low-resistance layer is electrically connected to the lead frame. With this structure, the obverse surface of the photo detector is held at the ground potential and the intrusion of electromagnetic noise from outside, that is, external noise can be prevented, so that the reception distance can be increased. In addition, since the junction between the p-type diffusion layer and the p-type low-resistance layer is not a pn junction, the generation of spontaneous noise is sufficiently suppressed.

29 Claims, 6 Drawing Sheets

PHOTO DETECTOR HAVING A PLURALITY OF SEMICONDUCTOR LAYERS

BACKGROUND OF THE INVENTION

1. Field of the Invention

The present invention relates to a photo detector for use in a semiconductor device for infrared remote control reception.

2. Description of the Prior Art

An infrared remote control system widely used in household electrical appliances comprises a transmitter operated in hand and a receiver mounted on an appliance such as a television. In order that the transmitter can be operated even at a distance of 20 m or more from the receiver, the receiver is provided with a high amplification degree. For this reason, the receiver is susceptible to electromagnetic noise coming from outside sources.

Therefore, in a conventional photo detector for use in a receiver, for example, as disclosed in Japanese Laid-open Patent Application No. H3-159180, a shield layer that transmits light is formed on the entire surface of a light receiving portion, or a striped, mesh or radial shield layer that transmits light is formed on the surface of the light receiving portion, and electrode wiring is drawn out of the shield layer and the potential thereof is connected to the ground potential, thereby enhancing noise immunity. Specifically, an $n^+$ region is diffused into a p-type substrate to form the light receiving portion, the shield layer is formed of a shallow $p^+$-type diffusion layer on the $n^+$-type region constituting the light receiving portion, and the pn junction forming the light receiving portion is surrounded by the p-type substrate and the shield layer to thereby prevent the influence of external noise.

However, in the conventional photo detector, since the shield layer is formed of the shallow $p^+$-type diffusion layer on the $n^+$-type region, the $p^+$-type diffusion layer serving as the shield layer forms a junction in the $n^+$-type region and spontaneous noise is generated from the $p^+n^+$ junction, so that the reception distance is shortened. The relationship between the external noise suppressed by the shield layer and the spontaneous noise generated because of the formation of the shield layer is as follows: if the resistance is reduced by increasing the impurity concentration of the $p^+$-type diffusion layer of the shield layer in order to effectively reduce the external noise, the spontaneous noise increases that is generated from the $p^+n^+$ junction formed of the $n^+$-type region and the $p^+$-type diffusion layer of the shield layer, so that the reception distance is shortened, and if the impurity concentration is decreased in order to reduce the generation of the spontaneous noise, the shielding function deteriorates to degrade the external noise canceling capability, so that the reception distance is shortened. Thus, according to the structure of the conventional photo detector, it is impossible to sufficiently reduce the noise and it is difficult to increase the reception distance. In order to increase the reception distance, it matters how the spontaneous noise generated due to the shield layer is reduced.

Here, the spontaneous noise will be explained. The spontaneous noise is normal noise generated at a pn junction of a diode, and contributes to the dark current of the light receiving portion. That is, the spontaneous noise is proportional to the dark current generated at the time of reverse bias. The level of the spontaneous noise is high when the $p^+$-type region and the $n^+$-type region of the $p^+n^+$ junction are both high in impurity concentration, and is low when at least one of the regions is low in impurity concentration.

This will be explained by use of an expression. A current represented by the following expression flows through the p-type shield portion and the n-type light receiving portion:

$$I=qA[D_pN_aL_p^{-1}\times exp\{-(\phi_0+V_R)/V_T\}+D_nN_dL_n^{-1}\times exp\{-(\phi_0+V_R)/V_T\}]\times\{exp(-V_R/V_T)-1\}$$

where $D_p$ and $D_n$ are diffusion coefficients, $L_p$ and $L_n$ are diffusion lengths, $\phi_0$ is the junction potential, $V_R$ is the reverse bias potential, $V_T=kT/q$, A is the junction area, $N_a$ is the p-type impurity concentration, and $N_d$ is the n-type impurity concentration.

As is apparent from the expression, the spontaneous noise increases as the impurity concentrations increases. The spontaneous noise also depends on the applied reverse bias voltage. The noise becomes a problem when the surface impurity concentration becomes on the order of $10^{17}$ or higher in both the p-type region and the n-type region.

SUMMARY OF THE INVENTION

An object of the present invention is to provide a photo detector in which the generation of spontaneous noise is suppressed, the influence of external noise is prevented and the reception distance is increased.

A photo detector of a first aspect of the invention comprises: an n-type semiconductor substrate; a p-type layer provided on an obverse side of the n-type semiconductor substrate; a p-type low-resistance layer provided on an obverse side of the p-type layer; a conductor provided on a reverse side of the n-type semiconductor substrate with an insulator in between; a substrate connecting region provided in a region within the n-type semiconductor substrate, the region being different from a region in which the p-type layer is provided; and an electric connection conductor for electrically connecting the low-resistance layer and the conductor.

According to the photo detector of the first aspect of the invention, since the p-type layer is provided on the obverse side of the n-type semiconductor substrate, the p-type low-resistance layer is provided on the obverse side of the p-type layer and the low-resistance layer is electrically connected to the conductor provided on the reverse side of the n-type semiconductor substrate with the insulator in between, the obverse surface of the photo detector is held at the ground potential and the intrusion of electromagnetic noise from outside, that is, the influence of external noise is prevented, so that the reception distance is increased. In addition, since the low-resistance layer is of p type and no pn junction is formed at the junction between the p-type layer and the low-resistance layer, the generation of spontaneous noise is suppressed. In devices such as remote control devices that receive information by light, noise prevention is indispensable, and the photo detector of this invention being excellent in noise immunity not only achieves size reduction but also produces great economic advantages.

A photo detector of a second aspect of the invention comprises: an n-type semiconductor substrate; a p-type layer provided on an obverse side of the n-type semiconductor substrate; an n-type low-resistance layer provided on an obverse side of the p-type layer; a p-type layer connecting region provided in an unoccupied region of the low-resistance layer within the p-type layer; a conductor provided on a reverse side of the n-type semiconductor substrate with an insulator in between; a substrate connecting region provided in a region within the n-type semiconductor substrate, the region being different from a region in which the p-type layer is provided; and an electric connection conductor for electrically connecting the low-resistance layer and the conductor.

According to the photo detector of the second aspect of the invention, since the p-type layer is provided on the obverse side of the n-type semiconductor substrate, the n-type low-resistance layer is provided on the obverse side of the p-type layer and the low-resistance layer is electrically connected to the conductor provided on the reverse side of the n-type semiconductor substrate with the insulator in between, the obverse surface of the photo detector is held at the ground potential and the intrusion of electromagnetic noise from outside, that is, the influence of external noise is prevented, so that the reception distance is increased. In addition, since the p-type layer is not a high-impurity-concentration layer although the low-resistance layer is of n type, the generation of spontaneous noise is suppressed. In devices such as remote control devices that receive information by light, noise prevention is indispensable, and the photo detector of this invention being excellent in noise immunity not only achieves size reduction but also produces great economic advantages.

Particularly, in the above-described second aspect of the invention, it is preferable that the p-type layer connecting region is electrically connected to the conductor. With this connection configuration, the p-type layer and the low-resistance layer have the same potential and no reverse bias is applied even if a pn junction is formed at the junction between the p-type layer and the low-resistance layer, so that the generation of spontaneous noise is sufficiently suppressed. Moreover, in the second aspect of the invention, it is preferable in suppressing spontaneous noise that the surface impurity concentration of the p-type layer is $10^{14}$ to $10^{17}$ cm$^{-3}$ and the surface impurity concentration of the low-resistance layer is $10^{17}$ to $10^{19}$ cm$^{-3}$.

In the above-described first or second aspect of the invention, it is preferable in sufficiently suppressing external noise that the low-resistance layer occupies approximately half or more of an area of the p-type layer. Moreover, it is preferable that the low-resistance layer is provided by deposition diffusion of a material including at least an impurity because the resistance value of the low-resistance layer can be easily reduced. Moreover, contours of the p-type layer and the low-resistance layer on the n-type semiconductor substrate are substantially similar to each other. Particularly, in the second aspect of the invention, it is preferable in preventing the low-resistance layer from extending outside the p-type layer due to a mask pattern shift that the distance between the contours of the p-type layer and the low-resistance layer on the n-type semiconductor substrate is 5 to 40 μm which is greater than the mask pattern shift when the contours of the p-type layer and the low-resistance layer on the n-type semiconductor substrate are substantially similar to each other.

Moreover, in the above-described first or second aspect of the invention, it is preferable in reducing the resistance value of the low-resistance layer to thereby enhance the external noise suppressing function that a striped or mesh metal wiring electrically connected to the electric connection conductor is provided in an obverse region of the low-resistance layer. Likewise, it is preferable in reducing the resistance value of the low-resistance layer to thereby enhance the external noise suppressing function that a metal wiring electrically connected to the electric connection conductor is provided in a peripheral region of the low-resistance layer.

Moreover, in the above-described first or second aspect of the invention, the conductor is, for example a metal lead frame and the electric connection conductor is, for example, a metal wire.

Moreover, in the above-described first or second aspect of the invention, for example, a reverse surface of the n-type semiconductor substrate is fixed to the conductor with an insulator in between.

DESCRIPTION OF THE PREFERRED EMBODIMENTS

First Embodiment

A photo detector according to a first embodiment of the present invention will be described with reference to FIGS. 1 to 6.

Figure 1:
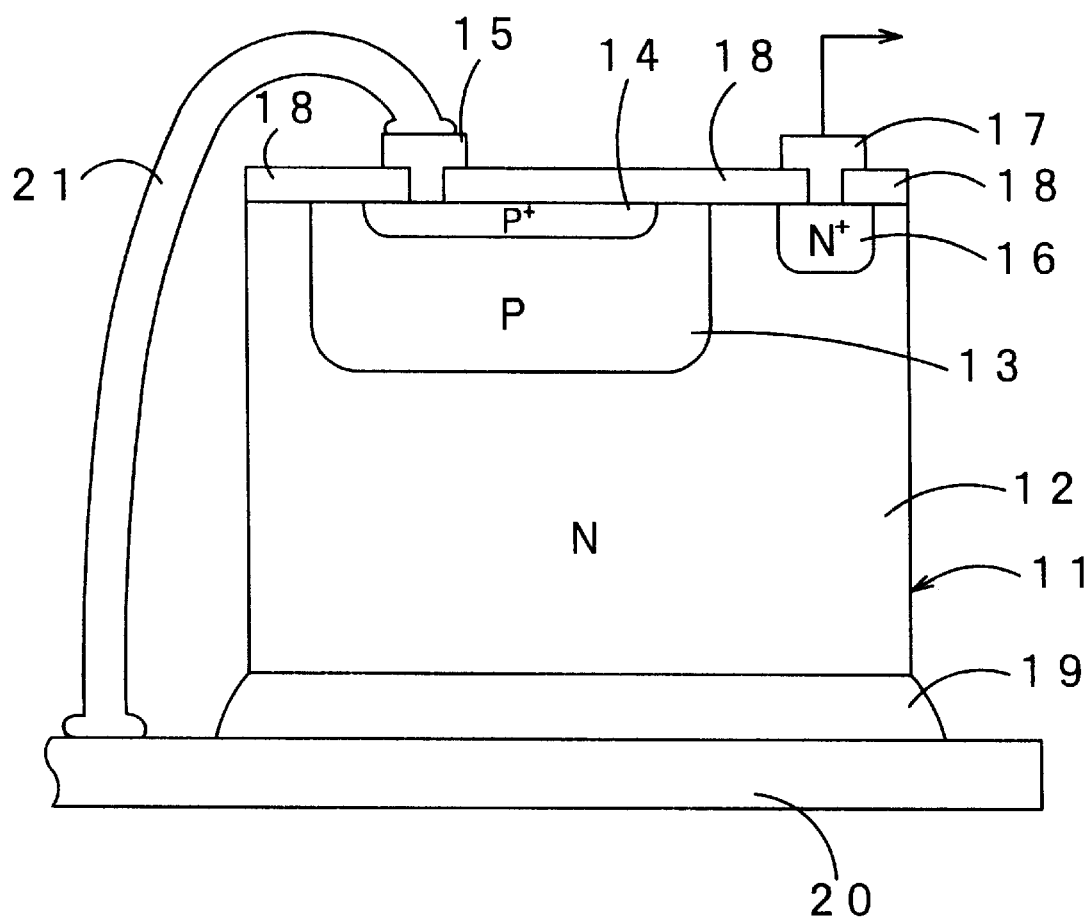
FIG. 1 is a cross-sectional view of a photo detector in a first embodiment of the present invention.

FIG. 1 is a cross-sectional view of a photodiode as the photo detector. The photodiode 11 comprises: an n-type semiconductor substrate 12; a p-type diffusion layer 13 formed on the obverse surface of the n-type semiconductor substrate 12; a p-type low-resistance semiconductor diffusion layer 14 shallowly formed substantially on the entire obverse surface of the p-type diffusion layer 13; an anode electrode 15 formed on the obverse surface of the p-type low-resistance semiconductor diffusion layer 14; an n-type diffusion layer 16 serving as the substrate connecting region formed in a region of the n-type semiconductor substrate 12 that is different from the region where the p-type low-resistance semiconductor diffusion layer 14 is formed; a cathode electrode 17 formed on the obverse surface of the n-type diffusion layer 16; and a protective film 18 formed substantially on the entire surfaces of the n-type semiconductor substrate 12, the p-type diffusion layer 13, the p-type low-resistance semiconductor diffusion layer 14 and the n-type diffusion layer 16 excepting the contact portions of the anode electrode 15 and the cathode electrode 17.

The reverse surface of the photodiode 11 is bonded to a ground connection lead frame 20 serving as a conductor with an insulative resin film 19 serving as an insulator in between. The anode electrode 15 is bonded to the ground connection lead frame 20 by use of a metal bonding wire 21 serving as an electric connection conductor, and supplies the ground potential to the p-type low-resistance semiconductor diffusion layer 14. The output of the photodiode 11 is taken out from the cathode electrode 17 and is input to an external circuit such as an amplifier through connecting means such as a bonding wire (not shown).

The n-type semiconductor substrate 12 comprises a silicon semiconductor substrate with an impurity concentration of $10^{10}$ to $10^{16}$ cm$^{-3}$ and a specific resistance of 1 to 4000

Ω·cm. The p-type diffusion layer 13 is formed by depositing and diffusion boron (B) at 900° C. by use of a BN sheet, and has an surface impurity concentration of $10^{14}$ to $10^{17}$ cm$^{-3}$, a diffusion length of 2 to 6 μm and a specific resistance of 0.1 to 100 Ω·cm. The p-type low-resistance semiconductor diffusion layer 14 is formed by depositing boron (B) at 1050° C. by use of a BN sheet so as to be higher in concentration than the p-type diffusion layer 13, and has a surface impurity concentration of $10^{17}$ to $10^{19}$ cm$^{-3}$, a diffusion length of 0.5 to 2 μm and a specific resistance of 0.01 to 0.1 Ω·cm. The n-type diffusion layer 16 is formed by diffusion phosphorus (P) in an atmosphere of POCl$_3$ gas, and has a surface impurity concentration of $10^{17}$ to $10^{19}$ cm$^{-3}$, a diffusion length of 0.5 to 2 μm and a specific resistance of 0.01 to 0.1 Ω·cm. The ground connection lead frame 20 is formed by cutting out an SPCC (cold-rolled steel plate) with a thickness of 0.1 to 1 mm. The diffusion in the atmosphere of POCl$_3$ gas is performed by supplying POCl$_3$ liquid bubbled with N$_2$ gas to a diffusion reactor as the diffusion source gas. The diffusion using a BN sheet as the diffusion source is performed with a BN sheet and a semiconductor wafer disposed opposite to each other on a quartz boat.

While the diffusion layers 13, 14 and 16 are formed by deposition and diffusion or by diffusion by deposition, they may be formed by ion implantation. However, to obtain the p-type low-resistance semiconductor diffusion layer 14, by supplying the diffusion source to the semiconductor substrate, a low resistance that cannot be obtained by ion implantation is obtained and mass production is easier.

Figure 2:
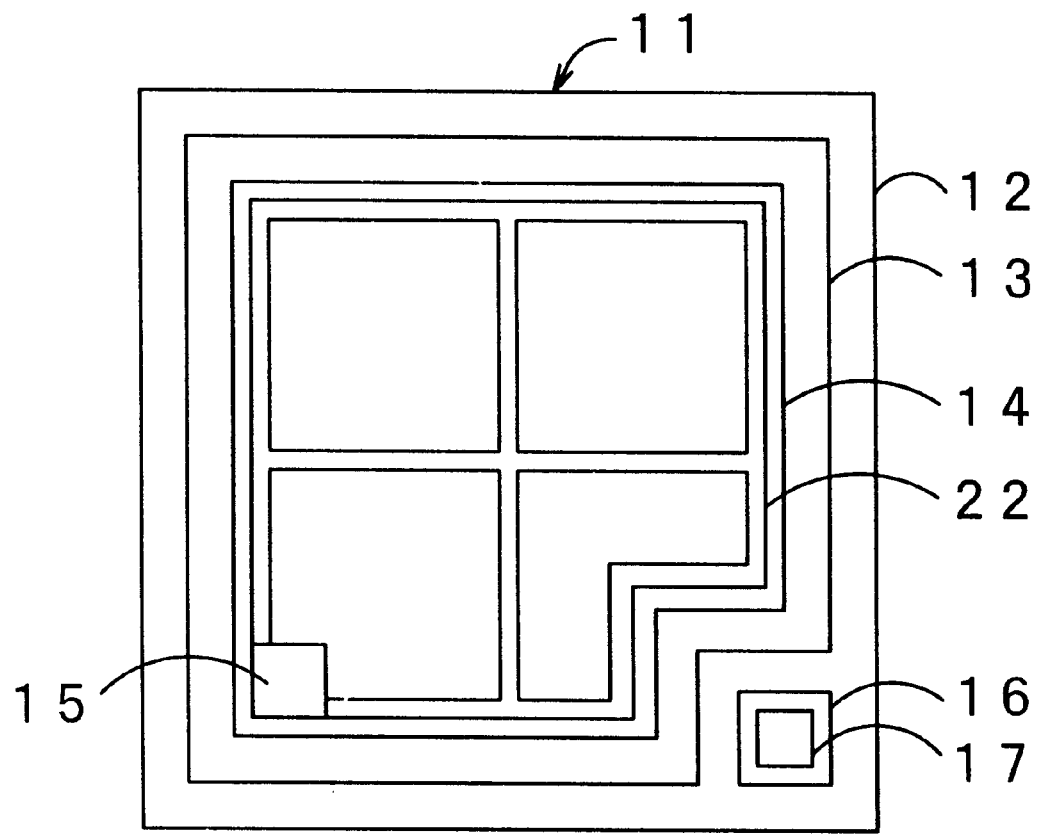
FIG. 2 is a plan view of the photo detector in the first embodiment of the present invention.

The obverse surface structure of the photodiode 11 is shown in FIG. 2. The p-type low-resistance semiconductor diffusion layer 14 is formed within the p-type diffusion layer 13 so that its contour on the substrate surface is substantially similar to that of the diffusion layer 13. However, there is no harm if the p-type low-resistance diffusion layer 14 is larger. In order to reduce the resistance components of the p-type low-resistance semiconductor diffusion layer 14, a striped or mesh aluminum wiring 22 is provided in the peripheral region and the obverse surface region of the p-type low-resistance semiconductor diffusion layer 14. The aluminum wiring 22 may be provided only in the peripheral region of the p-type low-resistance semiconductor diffusion layer 14. In this case, a sufficient radiation quantity is obtained. When the striped or mesh aluminum wiring 22 is provided, it is provided so that the wiring interval is not very short in order that a sufficient radiation quantity is obtained. There is no harm if no aluminum wiring 22 is provided.

FIG. 2 shows the structure of the lead frame 20. The lead frame 20 is formed by previously forming the insulative resin film 19 only in a region of the obverse surface of a metal frame 23 where the photodiode 11 is mounted. The bonding wire 21 is bonded to a region where no insulative resin film 19 is formed and the p-type low-resistance semiconductor diffusion layer 14 is held at the ground potential.

Figure 4:
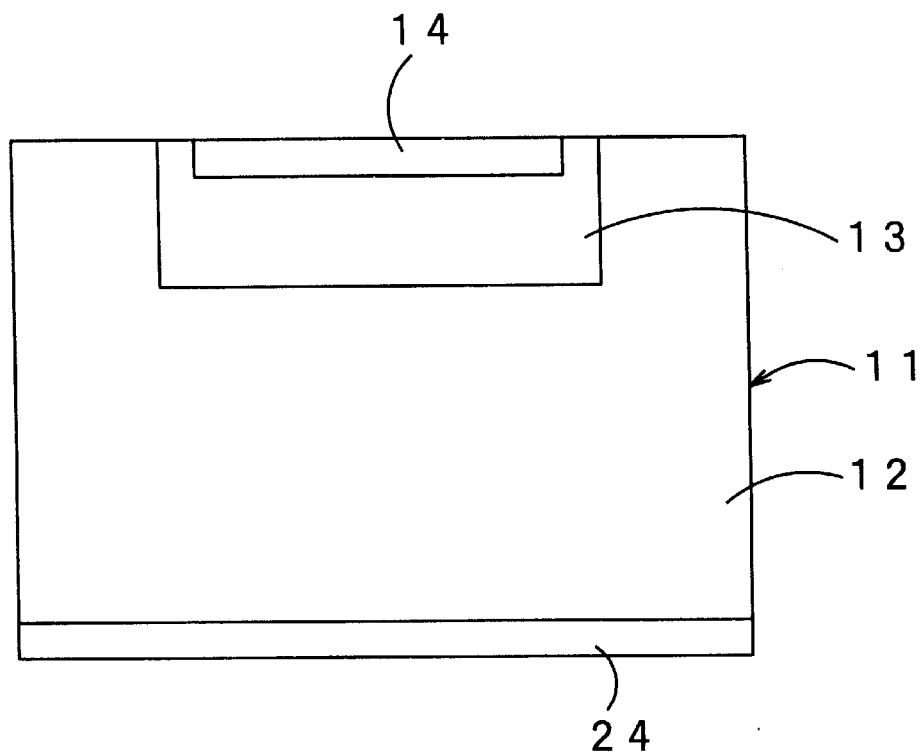
FIG. 4 is a cross-sectional view of a photodiode in the first embodiment of the present invention.

FIG. 4 is a cross-sectional view of the photodiode 11. A thermal oxidation film 24 with a thickness of 500 to 10000 Å is formed on the reverse surface of the n-type semiconductor substrate 12. Instead of the thermal oxidation film 24, another insulating film such as a nitride film may be formed.

Figure 5:
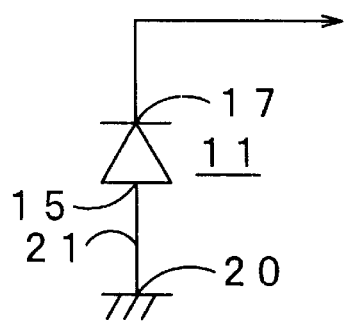
FIG. 5 is an equivalent circuit diagram in the first embodiment of the present invention.

FIG. 5 shows an equivalent circuit of the photodiode 11.

Figure 6:
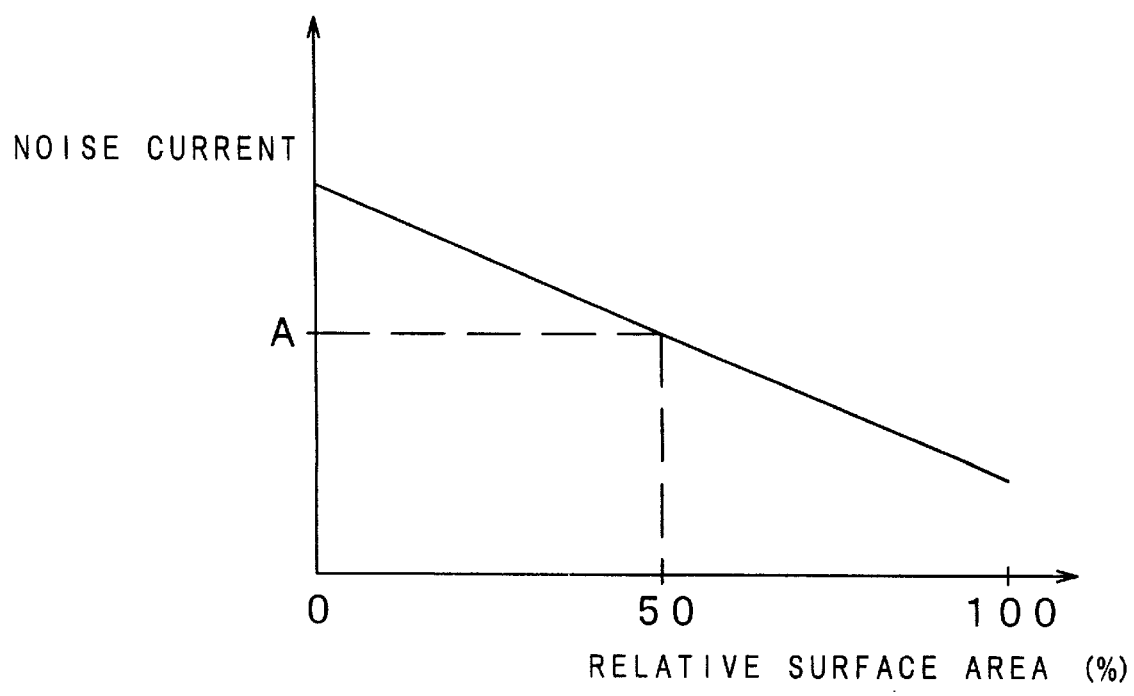
FIG. 6 is a graph showing the relationship between a relative surface area and a noise current in the first embodiment of the present invention.

FIG. 6 shows the relationship between the surface area and the electromagnetic noise characteristic of the p-type low-resistance semiconductor diffusion layer 14 formed on the p-type diffusion layer 13. The lateral axis represents the relative surface area (%) of the p-type low-resistance semiconductor diffusion layer 14 with respect to the p-type diffusion layer 13, whereas the longitudinal axis represents the noise current of the photodiode 11. As the ratio of the relative surface area decreases, the noise current due to the electromagnetic noise increases. When the p-type low-resistance semiconductor diffusion layer 14 occupies half or less of the area of the p-type diffusion layer 13, the noise current A of the prior art is exceeded.

According to the photo detector thus structured, since the p-type diffusion layer 13 is provided on the obverse side of the n-type semiconductor substrate 12, the p-type low-resistance semiconductor diffusion layer 14 is provided on the obverse side of the p-type diffusion layer 13 and the p-type low-resistance semiconductor diffusion layer 14 is electrically connected to the lead frame 20, the obverse surface of the photodiode 11 is held at the ground potential and the intrusion of the electromagnetic noise, that is, the external noise is prevented, so that the reception distance is increased. In addition, since the p-type low-resistance diffusion layer 14 is of p$^+$ type and the junction between the p-type diffusion layer 13 and the p-type low-resistance semiconductor diffusion layer 14 is not a p$^+$n$^+$ junction, the generation of the spontaneous noise is sufficiently suppressed.

The IC chip constituting the amplifier is preferably mounted on the lead frame 20 so as to adjoin the photodiode 11.

The photo detector may be encapsulated in light transmitting resin.

Second Embodiment

A photo detector according to a second embodiment of the present invention will be described with reference to FIGS. 7 and 8.

Figure 7:
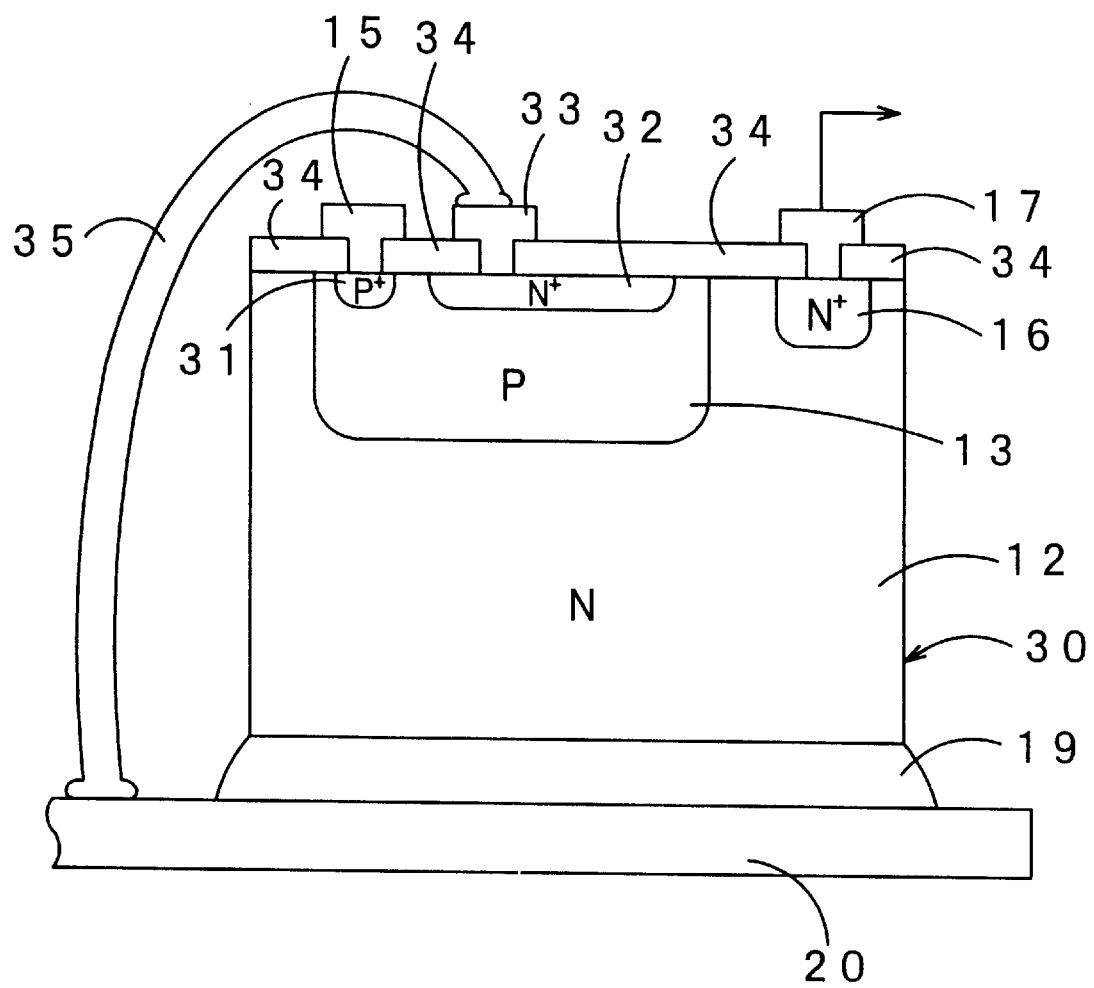
FIG. 7 is a cross-sectional view of a photo detector in a second embodiment of the present invention.

FIG. 7 is a cross-sectional view of a photodiode as the photo detector. The photodiode 30 comprises: an n-type semiconductor substrate 12; a p-type diffusion layer 13 formed on the obverse surface of the n-type semiconductor substrate 12; an n-type low-resistance semiconductor diffusion layer 32 shallowly formed substantially on the entire obverse surface of the p-type diffusion layer 13; a p-type diffusion layer 31 serving as a p-type layer connecting region for contact of an anode electrode 15 formed in an unoccupied region of the n-type low-resistance semiconductor diffusion layer 32 within the p-type diffusion layer 13; a shield electrode 33 formed on the obverse surface of the n-type low-resistance semiconductor diffusion layer 32; an n-type diffusion layer 16 serving as the substrate connecting region formed in a region of the n-type semiconductor substrate 12 that is different from the region where the n-type low-resistance semiconductor diffusion layer 32 is formed; a cathode electrode 17 formed on the obverse surface of the n-type diffusion layer 16; and a protective film 34 formed substantially on the entire obverse surfaces of the n-type semiconductor substrate 12, the p-type diffusion layer 13, the p-type diffusion layer 31, the n-type low-resistance semiconductor diffusion layer 32 and the n-type diffusion layer 16 excepting the contact portions of the anode electrode 15, the cathode electrode 17 and the shield electrode 33.

The reverse surface of the photodiode 30 is bonded to a ground connection lead frame 20 with an insulative resin film 19 in between. The shield electrode 33 is bonded to the ground connection lead frame 20 by use of a metal bonding wire 35 and supplies the ground potential to the n-type low-resistance semiconductor diffusion layer 32. While the anode electrode 15 may be supplied with the ground potential by a bonding wire, it may be previously connected to the shield electrode 33 by an aluminum wiring 37 (FIG. 8). In this case, the bonding wire 35 may be connected to either of the anode electrode 15 and the shield electrode 33. The output of the photo diode 30 is taken out from the cathode electrode 17 and is input to an external circuit such as an amplifier through connecting means such as a bonding wire (not shown).

The n-type semiconductor substrate 12 comprises a silicon semiconductor substrate with an impurity concentration of $10^{10}$ and $10^{16}$ cm$^{-3}$ and a specific resistance of 1 to 4000 Ω·cm. The p-type diffusion layer 13 is formed by depositing the diffusing boron (B) at 900° C. by use of a BN sheet, and has an surface impurity concentration of $10^{14}$ to $10^{17}$ cm$^{-3}$, a diffusion length of 2 to 6 μm and a specific resistance of 0.1 to 100 Ω·cm. The p-type diffusion layer 31 is formed by depositing boron (B) at 1050° C. by use of a BN sheet so as to be higher in concentration than the p-type diffusion layer 13, and has a surface impurity concentration of $10^{17}$ to $10^{19}$ cm$^{-3}$, a diffusion length of 0.5 to 2 μm and a specific resistance of 0.01 to 0.1 Ω·cm. The n-type low-resistance semiconductor diffusion layer 32 is formed by diffusion of phosphorus (P) in an atmosphere of POCl$_3$ gas, and has a surface impurity concentration of $10^{17}$ to $10^{19}$ cm$^{-3}$, a diffusion length of 0.5 to 2 μm and a specific resistance of 0.01 to 0.1 Ω·cm. The n-type diffusion layer 16 is formed by diffusing phosphorus (P) in an atmosphere of POCl$_3$ gas, and has a surface impurity concentration of $10^{17}$ to $10^{19}$ cm$^{-3}$ and a diffusion length of 0.5 to 2 μm. The ground connection lead frame 20 is formed by cutting out an SPCC (cold-rolled steel plate) with a thickness of 0.1 to 1 mm.

While the diffusion layers 13, 16, 31 and 32 are formed by deposition and diffusion of an impurity source serving as the diffusion source or by diffusion from a vapor phase, they may be formed by ion implantation. However, to obtain the n-type low-resistance semiconductor diffusion layer 32, a lower resistance is obtained and mass production is easier by diffusion from a vapor phase than by ion implantation.

On the surface of the n-type semiconductor 12, in order that the peripheral portions of the p-type diffusion layer 13 and the p-type diffusion layer 31 and the peripheral portions of the p-type diffusion layer 13 and the n-type low-resistance semiconductor diffusion layer 32 are out of contact with each other, for example, in order that there is no harm if a position variation occurs because of rough mask alignment, a margin of w=5 to 40 μm is provided in the direction of the width, and in order that the n-type low-resistance semiconductor diffusion layer 32 does not penetrate the p-type diffusion layer 13 even if a size variation occurs in the diffusion, a margin of d=1.5 to 5.5 μm is provided in the direction of the depth. An interval of approximately 5 to 40 μm is provided between the peripheral portions of the p-type diffusion layer 31 and the n-type low-resistance semiconductor diffusion layer 32.

Figure 8:
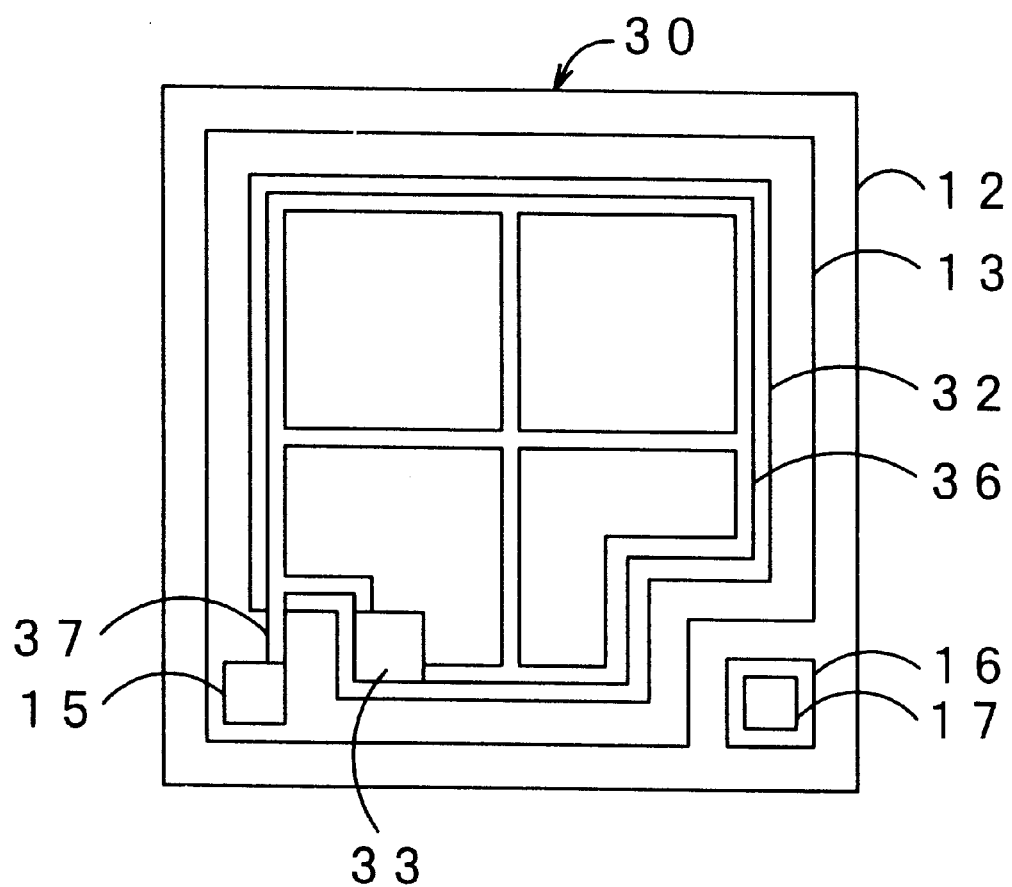
FIG. 8 is a plan view of the photo detector in the second embodiment of the present invention.

The obverse surface structure of the photo diode 30 is shown in FIG. 8. In order to reduce the resistance components of the n-type low-resistance semiconductor diffusion layer 32, a striped or mesh aluminum wiring 36 is provided in the peripheral region and the obverse surface region of the n-type low-resistance semiconductor diffusion layer 32. The aluminum wiring 36 may be provided only in the peripheral region of the n-type low-resistance semiconductor diffusion layer 32. In this case, a sufficient radiation quantity is obtained. When the striped or mesh aluminum wiring 36 is provided, it is provided so that the wiring interval is not very short in order that a sufficient radiation quantity is obtained. There is no harm if no aluminum wiring 36 is provided.

Figure 3:
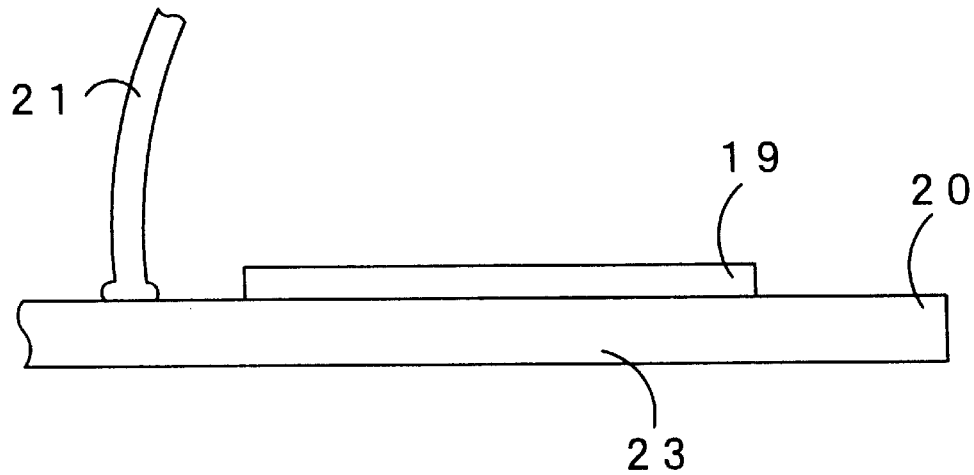
FIG. 3 is a cross-sectional view of a lead frame in the first embodiment of the present invention.

The structure of the lead frame and the reverse surface structure of the semiconductor substrate of the second embodiment are the same as those shown in FIGS. 3 and 4.

According to the photo detector thus structured, since the p-type diffusion layer 13 is provided on the obverse side of the n-type semiconductor substrate 12, the n-type low-resistance semiconductor diffusion layer 32 is provided on the obverse side of the p-type diffusion layer 13 and the n-type low-resistance semiconductor diffusion layer 32 is electrically connected to the lead frame 20, the obverse surface of the photodiode 11 is held at the ground potential and the intrusion of the electromagnetic noise, that is, the external noise is prevented, so that the reception distance is increased. In addition, since the n-type low-resistance diffusion layer 32 is of n$^+$ type and the junction between the p-type diffusion layer 13 and the p-type low-resistance semiconductor diffusion layer 14 is a pn$^+$ junction which is lower in impurity concentration than the p$^+$n$^+$ junction, the generation of the spontaneous noise is sufficiently reduced. Particularly, in this embodiment, since the p-type diffusion layer 13 and the p-type low-resistance semiconductor diffusion layer 14 are electrically connected so as to have the same potential (ground), the spontaneous noise can be eliminated in theory. In addition, since the p-type diffusion layer 13 and the n-type low-resistance semiconductor diffusion layer 32 are insulated from each other by a depletion layer, the electromagnetic noise never intrudes into the p-type diffusion layer 13, so that more complete electromagnetic shielding effects are delivered.

The n-type low-resistance semiconductor diffusion layer 32 and the n-type diffusion layer 16 may be formed by the same process.

It is to be understood that the photo detector of this embodiment can be used with the p-type diffusion layer 13 and the p-type low-resistance semiconductor diffusion layer 14 not connected to each other, and in this case, the spontaneous noise is also sufficiently reduced.

What is claimed is:

1. A photo detector comprising:
    an n-type semiconductor substrate;
    a p-type layer provided on an obverse side of said n-type semiconductor substrate;
    a p-type low-resistance layer provided on an obverse side of said p-type layer;
    a conductor provided on a reverse side of said n-type semiconductor substrate with an insulator in between;
    a substrate connecting region provided in a region within said n-type semiconductor substrate, said region being different from a region in which said p-type layer is provided; and
    an electric connection conductor for electrically connecting said low-resistance layer and said conductor.

2. A photo detector according to claim 1, wherein a reverse surface of said n-type semiconductor substrate is fixed to said conductor with an insulator in between.

3. A photo detector according to claim 1, wherein said conductor is a metal lead frame and said electric connection conductor is a metal wire.

4. A photo detector according to claim 1, wherein a surface impurity concentration of said p-type layer is $10^{14}$ to $10^{17}$ cm$^{-3}$ and a surface impurity concentration of said low-resistance layer is $10^{17}$ to $10^{19}$ cm$^{-3}$.

5. A photo detector according to claim 1, wherein said low-resistance layer occupies approximately half or more of an obverse side area of said p-type layer.

6. A photo detector according to claim 1, wherein said low-resistance layer is formed by deposition diffusion of a material including at least an impurity.

7. A photo detector according to claim 1, wherein contours of said p-type layer and said low-resistance layer on said n-type semiconductor substrate are substantially similar to each other.

8. A photo detector according to claim 1, wherein a metal wiring electrically connected to said electric connection conductor is provided in a peripheral region of said low-resistance layer.

9. A photo detector according to claim 1, wherein a striped or mesh metal wiring electrically connected to said electric connection conductor is provided in an obverse region of said low-resistance layer.

10. A photo detector comprising:
an n-type semiconductor substrate;
a p-type layer provided on an obverse side of said n-type semiconductor substrate;
an n-type low-resistance layer provided on an obverse side of said p-type layer;
a p-type layer connecting region provided in an unoccupied region of said low-resistance layer within said p-type layer;
a conductor provided on a reverse side of said n-type semiconductor substrate with an insulator in between;
a substrate connecting region provided in a region within said n-type semiconductor substrate, said region being different from a region in which said p-type layer is provided; and
an electric connection conductor for electrically connecting said low-resistance layer and said conductor.

11. A photo detector according to claim 10, wherein a reverse surface of said n-type semiconductor substrate is fixed to said conductor with an insulator in between.

12. A photo detector according to claim 10, wherein said conductor is a metal lead frame and said electric connection conductor is a metal wire.

13. A photo detector according to claim 10, wherein a surface impurity concentration of said p-type layer is $10^{14}$ to $10^{17}$ cm$^{-3}$ and a surface impurity concentration of said low-resistance layer is $10^{17}$ to $10^{19}$ cm$^{-3}$.

14. A photo detector according to claim 10, wherein a metal wiring electrically connected to said electric connection conductor is provided in a peripheral region of said low-resistance layer.

15. A photo detector according to claim 10, wherein said low-resistance layer occupies approximately half or more of an obverse side area of said p-type layer.

16. A photo detector according to claim 2, wherein contours of said p-type layer and said low-resistance layer on said n-type semiconductor substrate are substantially similar to each other, and an interval between the contours of said p-type layer and said low-resistance layer on said n-type semiconductor substrate is 5 to 40 µm.

17. A photo detector according to claim 10, wherein said low-resistance layer is formed by deposition diffusion of a material including at least an impurity.

18. A photo detector according to claim 10, wherein a striped or mesh metal wiring electrically connected to said electric connection conductor is provided in an obverse region of said low-resistance layer.

19. A photo detector according to claim 10, wherein contours of said p-type layer and said low-resistance layer on said n-type semiconductor substrate are substantially similar to each other.

20. A photo detector according to claim 10, wherein said p-type layer connecting region is electrically connected to said conductor.

21. A photo detector according to claim 20, wherein contours of said p-type layer and said low-resistance layer on said n-type semiconductor substrate are substantially similar to each other, and an interval between the contours of said p-type layer and said low-resistance layer on said n-type semiconductor substrate is 5 to 40 µm.

22. A photo detector according to claim 20, wherein a surface impurity concentration of said p-type layer is $10^{14}$ to $10^{17}$ cm$^{-3}$ and a surface impurity concentration of said low-resistance layer is $10^{17}$ to $10^{19}$ cm$^{-3}$.

23. A photo detector according to claim 20, wherein a striped or mesh metal wiring electrically connected to said electric connection conductor is provided in an obverse region of said low-resistance layer.

24. A photo detector according to claim 20, wherein said low-resistance layer occupies approximately half or more of an obverse side area of said p-type layer.

25. A photo detector according to claim 20, wherein a metal wiring electrically connected to said electric connection conductor is provided in a peripheral region of said low-resistance layer.

26. A photo detector according to claim 20, wherein said low-resistance layer is formed by deposition diffusion of a material including at least an impurity.

27. A photo detector according to claim 20, wherein said conductor is a metal lead frame and said electric connection conductor is a metal wire.

28. A photo detector according to claim 20, wherein contours of said p-type layer and said low-resistance layer on said n-type semiconductor substrate are substantially similar to each other.

29. A photo detector according to claim 20, wherein a reverse surface of said n-type semiconductor substrate is fixed to said conductor with an insulator in between.

* * * * *